United States Patent [19]

Kondo

[11] Patent Number: 5,572,539
[45] Date of Patent: Nov. 5, 1996

[54] II-VI SEMICONDUCTOR LASER WITH DIFFERENT GUIDE LAYERS

[75] Inventor: Kenji Kondo, Kanagawa, Japan

[73] Assignee: Sony Corporation, Tokyo, Japan

[21] Appl. No.: 394,742

[22] Filed: Feb. 27, 1995

[30] Foreign Application Priority Data

Mar. 15, 1994 [JP] Japan .................................. 6-071496

[51] Int. Cl.⁶ ..................................................... H01S 3/18
[52] U.S. Cl. ................................................ 372/45; 372/43
[58] Field of Search ........................... 372/45, 43; 257/13

[56] References Cited

U.S. PATENT DOCUMENTS 5,319,219  6/1994  Cheng et al. ............................. 372/45
5,341,001  8/1994  Hayashi et al. .......................... 372/45
5,508,522  4/1996  Nakanishi et al. ....................... 257/13

FOREIGN PATENT DOCUMENTS 6-97572  4/1994  Japan ....................................... 372/45

*Primary Examiner*—Rodney B. Bovernick
*Assistant Examiner*—Yisun Song
*Attorney, Agent, or Firm*—Hill, Steadman & Simpson

[57] ABSTRACT

An optical device capable of effectively confining light to its light guide layers and preventing increase of the threshold value and decrease of the differential efficiency. The device comprises a II–VI compound semiconductor and has a substrate made from a compound semiconductor on which at least a first light guide layer, an active layer or a light waveguide layer, and a second light guide layers are formed in this order. The first light guide layer differs from the second light guide layer in composition or thickness.

7 Claims, 5 Drawing Sheets

NITROGEN GAS

II-VI SEMICONDUCTOR LASER WITH DIFFERENT GUIDE LAYERS

BACKGROUND OF THE INVENTION

1. Field of the Invention

The present invention relates to an optical device comprising a II–VI compound semiconductor and having a semiconductor laser or optical waveguide structure.

2. Description of the Related Art

In recent years, numerous attempts have been made to realize semiconductor lasers emitting blue-green light and made from II–VI compound semiconductor materials of ZnSe or ZnMgSSe, and various reports have been made thus far. Various structures of semiconductor devices have been proposed. Among them, a semiconductor laser device having a separate-confinement heterostructure (SCH structure) in which the threshold current density can be reduced has attracted attention.

Normally, a semiconductor laser device having the SCH structure can be manufactured by forming a first cladding layer, a first light guide layer, an active layer, a second light guide layer, and a second cladding layer successively on a compound semiconductor substrate. Heretofore, the light guide layers of semiconductor laser devices have been designed, taking account of only injection of currents, i.e., only the electrical characteristics. Therefore, the structure has not been optically optimized. That is, in order to enhance the light emission efficiency and to prevent electrons from recombining with positive holes without emitting light in the light guide layers, minimizing the thickness of the light guide layers has been considered to be preferable.

However, where the thickness of the light guide layers is reduced, light exudes through the light guide layers and spreads into the compound semiconductor substrate. In other words, the light is not completely confined by the light guide layers. The compound semiconductor substrate consisting of GaAs or the like absorbs a large portion of incident light. Therefore, a considerable portion of the light is absorbed by the compound semiconductor substrate. As a result, the threshold current density of the semiconductor laser device increases, thus lowering the differential efficiency. That is, it has been generally considered that there exists a conflicting relation between improvement of the electrical characteristics of the semiconductor laser device and improvement of the ability of the light guide layers to confine light.

SUMMARY OF THE INVENTION

Accordingly, it is an object of the present invention to provide an optical device which is capable of more effectively confining light to light guide layers and, if necessary, is able to prevent increase of the threshold current density and drop of the differential efficiency.

An optical device according to a first embodiment of the invention that achieves the above-described object is fabricated by successively forming at least a first light guide layer, an active layer or a light waveguide layer, and a second light guide layer on a compound semiconductor substrate. Each layer is made from a II–VI compound semiconductor. The first light guide layer differs in composition from the second light guide layer.

In the first embodiment described above, the index of refraction of the first light guide layer is preferably larger than that of the second light guide layer.

An optical device according to a second embodiment of the invention that achieves the above-described object is fabricated by successively forming at least a first light guide layer, an active layer or a light waveguide layer, and a second light guide layer on a compound semiconductor substrate. Each layer is made from a II–VI compound semiconductor. The first light guide layer differs in thickness from the second light guide layer.

In the second embodiment described above, the first light guide layer is preferably thicker than the second light guide layer. Furthermore, the index of refraction of the active layer is preferably smaller than that of the compound semiconductor substrate. The index of refraction of the first and second light guide layers is preferably smaller than that of the active layer. For example, the first and second light guide layers are made from ZnSe.

An optical device according to a third embodiment of the invention that achieves the above-described object is fabricated by successively forming at least a first light guide layer, an active layer or a light waveguide layer, and a second light guide layer on a compound semiconductor substrate. Each layer is made from a II–VI compound semiconductor. The first light guide layer differs in thickness and composition from the second light guide layer.

In the third embodiment described above, the first light guide layer is preferably thicker than the second light guide layer. Furthermore, the index of refraction of the first light guide layer is preferably larger than that of the second light guide layer.

In the optical device according to the first or third embodiment, the first and second light guide layers are preferably made from ZnSe and ZnSSe, respectively.

An optical device according to a fourth embodiment of the invention that achieves the above-described object is fabricated by successively forming at least a first light guide layer, an active layer or a light waveguide layer, and a second light guide layer on a compound semiconductor substrate. Each of the first and second light guide layers has a thickness of more than 80 nm and is made from ZnSe.

Optical devices according to these embodiments can make semiconductor laser devices or light waveguide structures.

In an optical device according to the present invention, the first light guide layer differs from the second light guide layer in composition, in thickness, or in both composition and thickness. The structure of the light guide layers is made unsymmetrical in this way. In consequence, the ability of the light guide layers to confine light can be improved without deteriorating the electrical characteristics.

Other objects and features of the invention will appear in the course of the description thereof, which follows.

DETAILED DESCRIPTION OF THE PREFERRED EMBODIMENTS

Examples of optical devices consisting of II–VI compound semiconductors according to the present invention are described hereinafter by referring to the accompanying drawings. In the following examples, each optical device consists of a semiconductor laser device.

EXAMPLE 1

Figure 1:
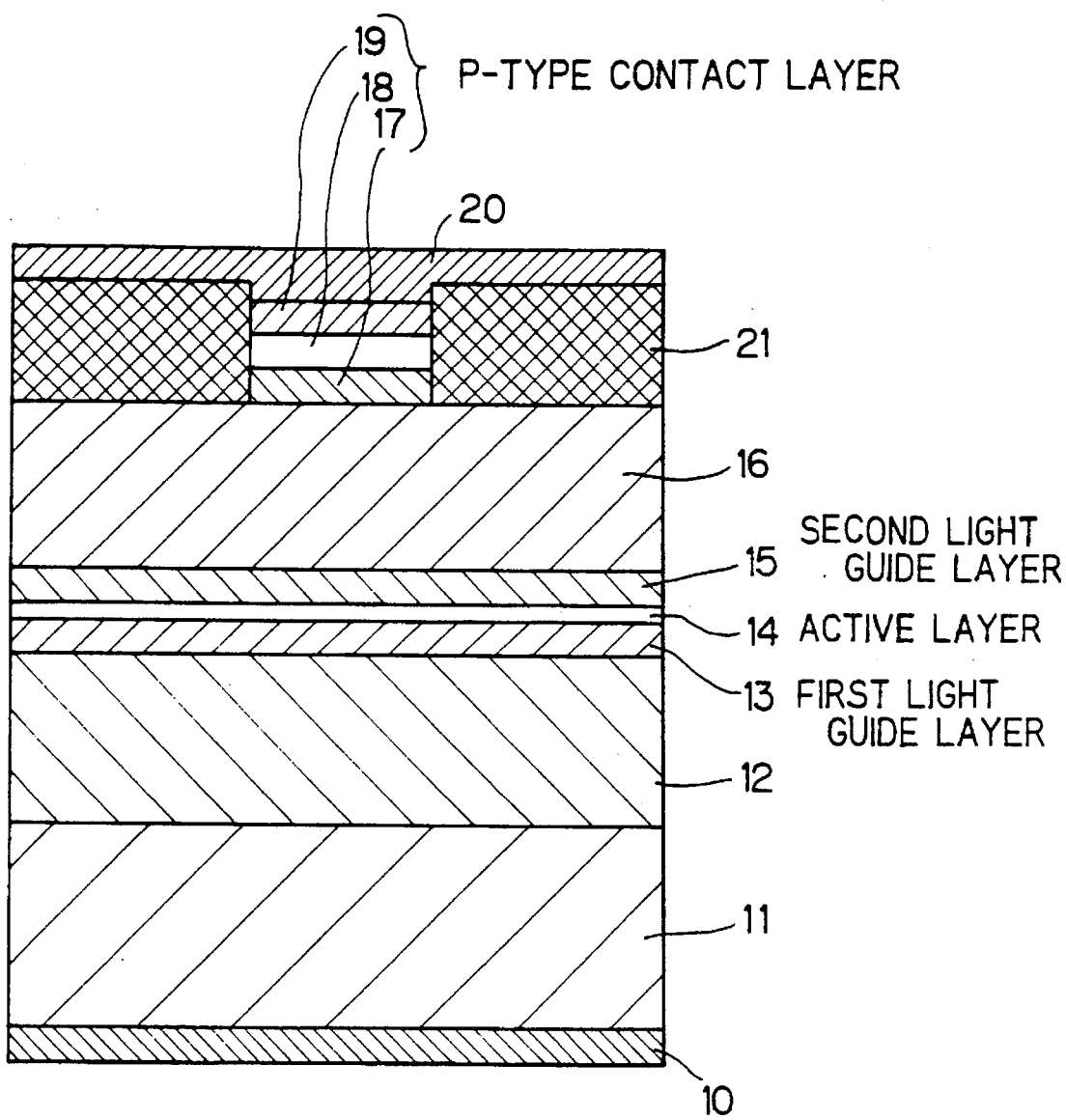
FIG. 1 is a schematic cross section of an optical device formed by a semiconductor laser according to the invention.

Example 1 is an optical device according to a first embodiment of the invention. This optical device is a semiconductor laser device having a separate-confinement heterostructure (SCH structure). As schematically shown in Fig. 1, this semiconductor laser device was fabricated by forming at least a first light guide layer 13 made from n-ZnSe, an active layer 14 made from ZnCdSe, and a second light guide layer 15 made from p-ZnSSe successively on a compound semiconductor substrate 11 that is made from n-GaAs. That is, these layers were made from II–VI compound semiconductors.

ZnSe had a smaller bandgap and a larger index of refraction than ZnSSe. The indices of refraction of ZnSe and ZnSSe were 2.7847 and 2.695, respectively. Therefore, the first light guide layer 13 made from ZnSe was inferior to the second light guide layer 15 made from ZnSSe in ability to confine electrons but superior in ability to confine light. Therefore, light can be effectively prevented from exuding from the first light guide layer 13 into the compound semiconductor substrate 11, by fabricating the first light guide layer 13 out of n-ZnSe. Hence, absorption of light by the compound semiconductor substrate 11, increase of the threshold current density of the semiconductor laser density, and decrease of the differential efficiency could be prevented.

More specifically, the semiconductor laser device that was an optical device according to Example 1 had the compound semiconductor substrate 11 on which the first light guide layer 13 was formed. The substrate 11 was made from n-GaAs, while the first light guide layer 13 was made from n-ZnSe. The thickness of the first light guide layer was set to 70 nm. A first cladding layer 12 having a thickness of 0.6 nm and made from n-$Zn_xMg_{1-x}S_ySe_{1-y}$ was formed between the substrate 11 and the first light guide layer 13.

The active layer 14 made from ZnCdSe was formed on the first light guide layer 13. The second light guide layer 15 made from p-ZnSSe was formed on the active layer 14. The thickness of the second light guide layer 15 was 70 nm. A second cladding layer 16 having a thickness of 0.6 nm and made from p-$Zn_xMg_{1-x}S_ySe_{1-y}$ was formed on the second light guide layer 15.

Formed on the second cladding layer 16 were a p-ZnSe layer 17 having a thickness of 0.6 μm, a multiple quantum well layer 18, and a p-ZnTe layer 19 having a thickness of 70 nm. This p-ZnTe layer 19 formed a p-type contact layer. The multiple quantum well layer 18 consisted of a barrier layer of p-ZnSe and a quantum well layer of p-ZnTe. A p-type electrode 20 made of Pd, Pt, and Au was formed on the p-type contact layer. An n-type electrode 10 made from In was formed on the bottom layer of the compound semiconductor substrate 11. Indicated by reference numeral 21 was a layer of aluminum oxide for suppressing electrical currents.

Figure 2:
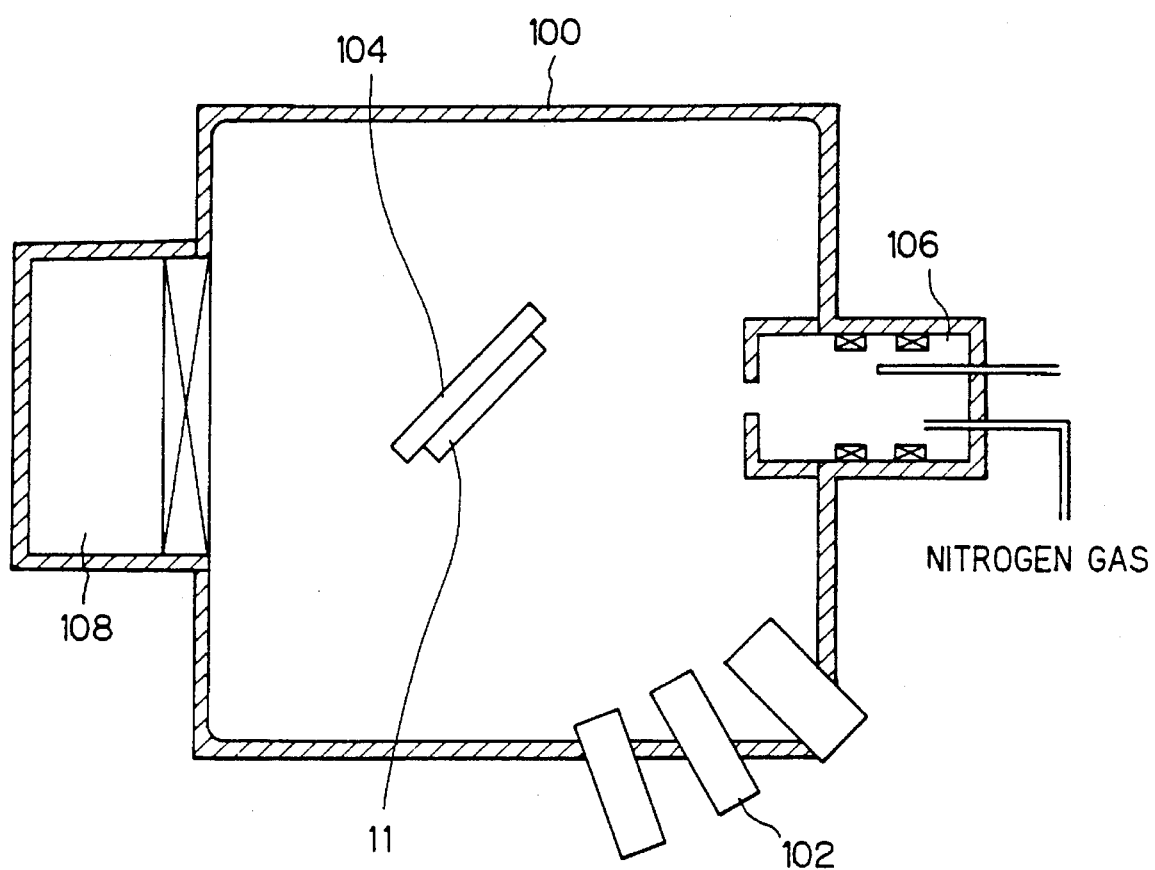
FIG. 2 is a schematic diagram of a molecular-beam epitaxy machine adapted for fabrication of a light-emitting device according to the invention.

The semiconductor laser device shown in FIG. 1 could be fabricated by molecular-beam epitaxy by the use of the molecular-beam epitaxy (MBE) machine schematically shown in Fig. 2. The MBE machine was a kind of vacuum evaporation machine and had a vacuum vessel 100 equipped with an ultrahigh vacuum evacuating machine. The vessel 100 contained a plurality of molecular beam sources (K cells) 102 and a substrate holder 104 that supported the substrate 11. The vessel 100 was further provided with an ECR plasma cell 106.

The compound semiconductor substrate 11 consisting of n-GaAs doped with Si was installed on the substrate holder 104 of the MBE machine. The substrate was heated to about 580° C. to clean the surface of the compound semiconductor substrate 11. Then, the temperature of the substrate 11 was lowered down to a desired optimum temperature (e.g., 280° C.) to start growth of the various layers.

First, the first cladding layer 12 made from the n-$Zn_xMg_{1-x}S_ySe_{1-y}$ doped with Cl was formed on the compound semiconductor substrate 11. $ZnCl_2$ was used for the doping of the Cl. The first light guide layer 13 made from n-ZnSe doped with Cl was formed on the first cladding layer 12. The active layer 14 made from ZnCdSe was formed on the first light guide layer 13.

Thereafter, the second light guide layer 15 made from the p-ZnSSe doped with nitrogen was formed on the active layer 14. The second cladding layer 16 made from the p-$Zn_xMg_{1-x}S_ySe_{1-y}$ doped with nitrogen was formed on the second light guide layer 15. The doping of the nitrogen was carried out, using RF plasma, in this step and also in steps described later.

Then, the p-type contact layer was formed. For this purpose, the p-ZnSe layer 17 doped with nitrogen was first formed on the second cladding layer 16. Subsequently, the quantum well layer consisting of p-ZnTe doped with nitrogen was formed on the p-ZnSe layer 17. Then, the barrier layer consisting of p-ZnSe was formed. The formation of the quantum well layer and the barrier layer was repeated as many as required, thus forming the multiple quantum well layer 18. This was followed by formation of the p-ZnTe layer 19 doped with nitrogen on the multiple quantum well layer 18.

Because the multiple quantum well structure described above was formed in the p-type contact layer, positive holes injected into the top layer, or the p-ZnTe layer 19, of the p-type contact layer tunneled through the multiple quantum well layer 18 across the quantum levels formed in the quantum well layers of the multiple quantum structure into the bottom layer, or the p-ZnSe layer 17, of the p-type contact layer. Consequently, a potential barrier due to discontinuity of the valence electron band at the junction of the top layer and the bottom layer of the p-type contact layer could be substantially eliminated. As a result, a good ohmic contact could be made between the p-type contact layer and the p-type electrode.

Then, Pd, Pt, and Au were deposited on the p-ZnTe layer 19 by electron-beam evaporation to form the p-type electrode 20. An n-type electrode 10 was formed out of In on the bottom surface of the compound semiconductor substrate 11. Finally, the substrate 11 was cleaved to effect faceting.

EXAMPLE 2

A semiconductor laser device having a structure similar to the structure of the device of Example 1 except that the first light guide layer 13 was made from n-ZnSSe and that the second light guide layer 15 was made from p-ZnSe was fabricated. The first light guide layer had a thickness of 70 nm and was made from n-ZnSSe. The second light guide layer had a thickness of 70 nm and was made from p-ZnSe.

COMPARATIVE EXAMPLE 1

A semiconductor laser device having a structure similar to the structure of Example 1 except that the first light guide layer 13 was made from n-ZnSSe was fabricated. The first light guide layer had a thickness of 70 nm and was made from n-ZnSSe. The second light guide layer had a thickness of 70 nm and was made from p-ZnSSe.

The light absorption coefficients of the semiconductor devices fabricated according to Examples 1, 2, and Comparative Example 1. The results are listed in Table 1 below.

TABLE 1

| structure | absorption coefficient | composition of first layer guide layer | composition of second light guide layer |
| --- | --- | --- | --- |
| Example 1 | 8 cm$^{-1}$ | n-ZnSe | p-ZnSSe |
| Example 2 | 12 cm$^{-1}$ | n-ZnSSe | p-ZnSe |
| Com. Ex. 1 | 18 cm$^{-1}$ | n-ZnSSe | p-ZnSSe |

Based on the results of the measurements of the absorption coefficients, the first and second light guide layers were formed from n-ZnSSe and p-ZnSe, respectively, in Example 2. As a result, light was more effectively confined by the light guide layers than in the case of Comparative Example 1. In Example 1, the first and second light guide layers were made from n-ZnSe and n-ZnSSe, respectively, so that light was more effectively confined.

EXAMPLE 3

Example 3 pertains to an optical device according to a second embodiment of the invention. More specifically, Example 3 pertains to a semiconductor laser device having a separate-confinement heterostructure (SCH structure). In the semiconductor laser device, at least a first light guide layer 13 made from n-ZnSe, an active layer 14 made from ZnCdSe, and a second light guide layer 15 made from p-ZnSe were successively formed on a compound semiconductor substrate 11 made from n-GaAs. These layers were made from II–VI compound semi-conductors.

Figure 5:
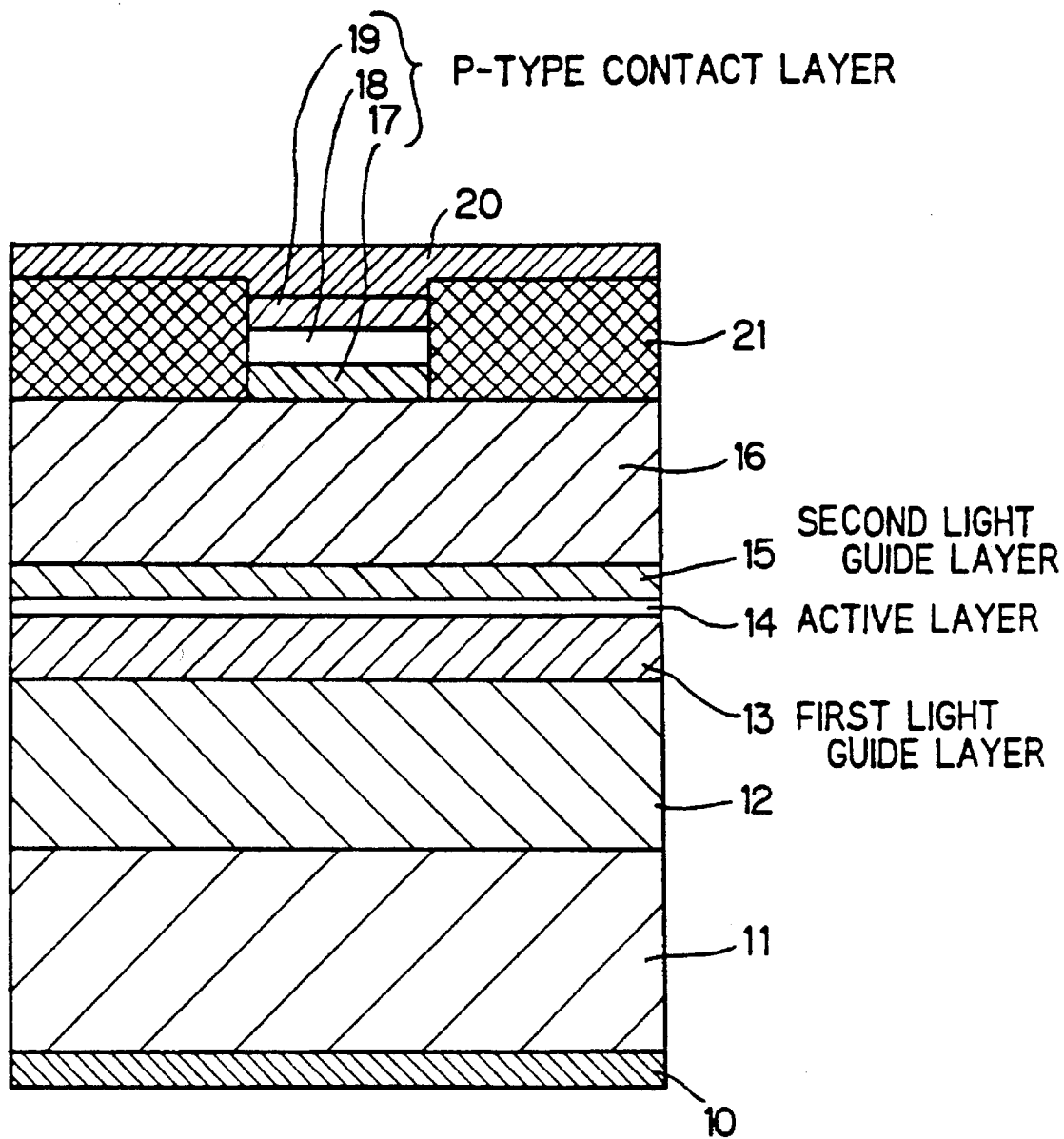
FIG. 5 is a schematic cross section of an optical device formed by a semiconductor laser according to the invention, wherein the first light guide layer is thicker than the second light guide layer.

The first light guide layer 13 differed in thickness from the second light guide layer 15. In Example 3, the first light guide layer 13 was thicker than the second light guide layer 15. For instance, the first light guide layer 13 had a thickness of 100 nm, while the second light guide layer 15 had a thickness of 80 nm. This is illustrated in FIG. 5.

The semiconductor laser device according to Example 3 could be fabricated similarly to the semiconductor device according to Example 1 except for the structures of the first and second light guide layers 13 and 15. Therefore, detailed description of the process for fabricating the laser device is omitted here.

The index of refraction of the active layer 14 made from ZnCdSe was 3.079, which was smaller than the index of refraction of 4.31 of the compound semiconductor substrate of GaAs. The index of refraction (=2.7847) of the first and second light guide layers 13 and 15, respectively, made from ZnSe was smaller than the index of refraction of the active layer.

By making the first light guide layer 13 thicker than the second light guide layer 15 in this way, light exudation from the first light guide layer 13 into the compound semiconductor substrate 11 could be suppressed. Hence, absorption of light by the compound semiconductor substrate 11, increase of the threshold current density of the semiconductor laser device, and decrease of the differential efficiency could be prevented.

COMPARATIVE EXAMPLE 2

A semiconductor laser device having a structure which was similar to Example 3 except that the first light guide layer 13 had a thickness of 80 nm and made from n-ZnSe was fabricated. In particular, the first and second light guide layers 13 and 15, respectively, were made from n-ZnSe, and each had a thickness of 80 nm.

The absorption coefficients of the semiconductor lasers of Example 3 and of Comparative Example 2 were measured. The results are listed in Table 2 below.

TABLE 2

| structure | absorption coefficient | first light guide layer | second light guide layer |
| --- | --- | --- | --- |
| Example 3 | 0 cm$^{-1}$ | 100 nm | 80 nm |
| Com. Ex. 2 | 1 cm$^{-1}$ | 80 nm | 80 nm |

It can be seen from the results of the measurements of the absorption coefficients that light can be confined especially by the first light guide layer 13 by making the thickness of the first light guide layer different from the thickness of the second light guide layer.

EXAMPLE 4

Example 4 pertains to an optical device according to a third embodiment of the invention. This optical device is a semiconductor laser device having a separate-confinement heterostructure (SCH structure). In this semiconductor laser device, at least the first light guide layer 13, the active layer 14, and the second light guide layer 15 were successively formed on the compound semiconductor substrate 11 consisting of n-GaAs. These layers were made from II–VI compound semi-conductors.

The first light guide layer 13 differed from the second light guide layer 15 in thickness and also in composition. In Example 4, the first light guide layer 13 was thicker than the second light guide layer 15. The first light guide layer 13 had an index of refraction larger than that of the second light guide layer 15. Specifically, the first light guide layer 13 was made from n-ZnSe. The second light guide layer 15 was made from p-ZnSSe.

The semiconductor laser device of Example 4 is similar in structure and fabrication method to the semiconductor laser device of Example 1 except for the structures of the first and second light guide layers 13 and 15. Therefore, detailed description of Example 4 is omitted here.

The second light guide layer 15 made from p-ZnSSe had a constant thickness of 69 nm. Semiconductor laser device samples having various thicknesses of the first light guide layer 13 of n-ZnSe were fabricated.

COMPARATIVE EXAMPLE 3

For comparison, the first light guide layer and the second light guide layer were made from n-ZnSSe and p-ZnSSe, respectively. Various semiconductor laser device samples having different thicknesses of the first and second light guide layers were fabricated. However, these samples had the same thickness of the first light guide layer and the same thickness of the second light guide layer.

Figure 3:
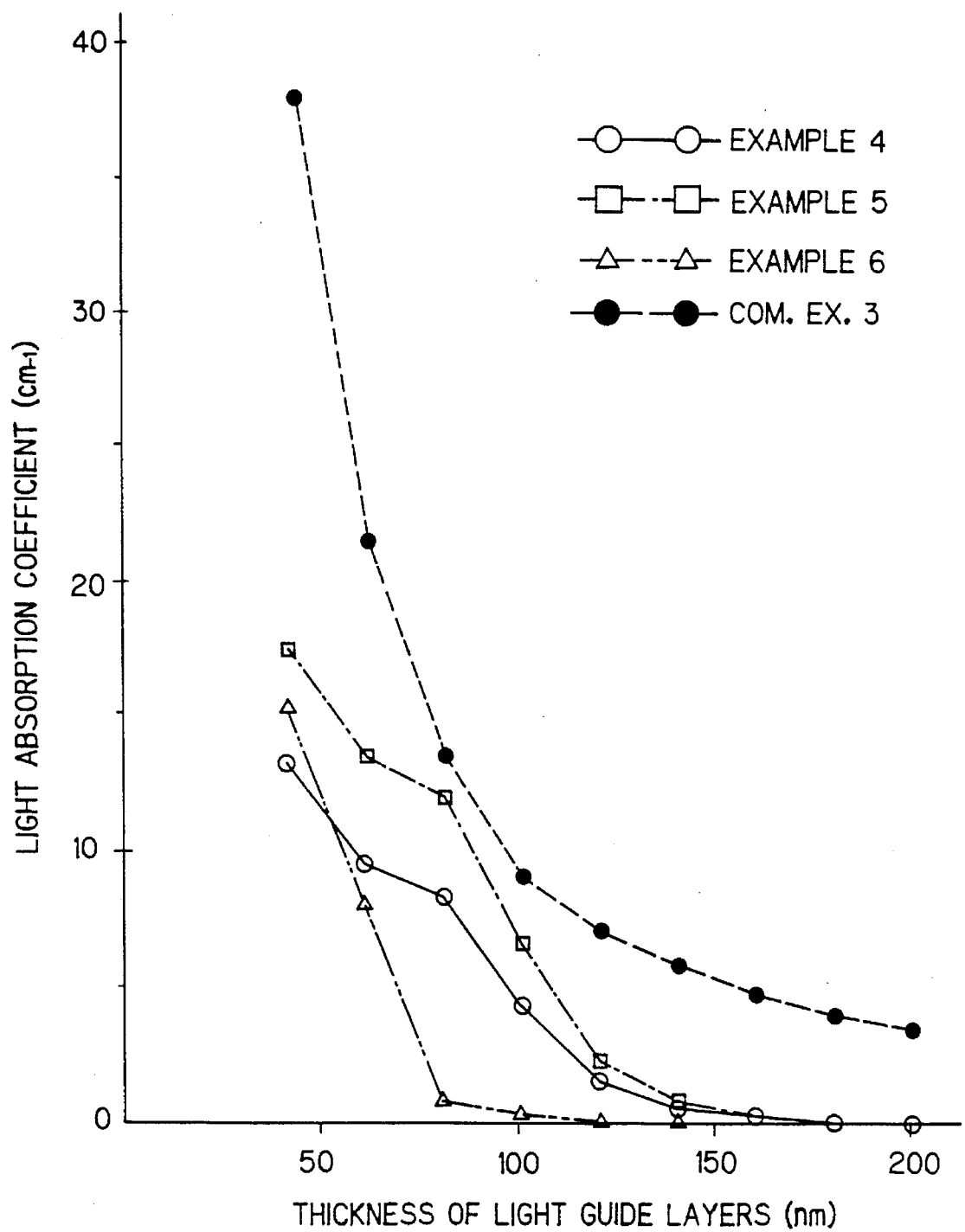
FIG. 3 is a graph showing the relation among the compositions, the thicknesses, and the light absorption coefficients of light guide layers of some examples of the invention and of a comparative example.

The light absorption coefficients of these semiconductor laser devices were measured. The results are shown in FIG. 3, where the results of the measurements of the semiconductor devices of Example 4 are indicated by small white circles and the solid line. The results of the measurements of the semi-conductor devices of Comparative Example 3 are indicated by small black circles and the broken line. As can be seen from FIG. 3, the semiconductor laser devices of Example 4 exhibited smaller light absorption coefficients, and their light guide layers were superior in ability to confine light.

EXAMPLE 5

Example 5 is a modification of Example 4. Example 5 is similar to Example 4 except that the first light guide layer 13 is made from n-ZnSSe and that the second light guide layer 15 is made from p-ZnSe. In particular, the index of refraction of the first light guide layer 13 was smaller than that of the second light guide layer 15. The second light guide layer 15 was thicker than the first light guide layer 13.

The semiconductor laser device of Example 5 is similar in structure and fabrication method to the semiconductor laser device of Example 1 except for the structures of the first and second light guide layers 13 and 15. Therefore, detailed description of Example 4 is omitted here.

Various semiconductor laser device samples were fabricated. Their first light guide layers 13 made from n-ZnSSe had a uniform thickness of 69 nm. Their second light guide layers 15 made from p-ZnSe had various thicknesses. The light absorption coefficients of these semiconductor laser device samples were measured. The results are indicated by the small rectangles and the dot-and-dash line in FIG. 3. As can be seen from FIG. 3, the semiconductor laser devices of Example 5 had smaller light absorption coefficients than the semiconductor laser devices obtained in Comparative Example 3 and were superior in ability to confine light by the light guide layers.

EXAMPLE 6

Example 6 pertains to an optical device according to a fourth embodiment of the invention. This optical device is a semiconductor laser device having a separate-confinement heterostructure (SCH structure). In this semiconductor laser device, at least the first light guide layer 13, the active layer 14, and the second guide layer 15 were successively formed on the compound semiconductor substrate 11 consisting of n-GaAs. These layers were made from II–VI compound semiconductors.

The first and second light guide layers 13 and 15, respectively, were made from ZnSe, and each had a thickness in excess of 80 nm. Where the thickness of the light guide layers 13 and 15 was less than 80 nm, the light absorption coefficient was large, in which case light was not sufficiently confined by the light guide layers. The upper limit of the thickness of the first and second light guide layers 13 and 15, respectively, may be determined, taking account of the time taken to form these light guide layers 13 and 15 by molecular-beam epitaxy, as well as other factors.

The semiconductor laser device of Example 6 is similar in structure and fabrication method to the semiconductor laser device of Example 1 except for the structures of the first and second light guide layers 13 and 15. Therefore, detailed description of Example 6 is omitted here.

Various semiconductor laser device samples were fabricated. Their first light guide layers 13 made from ZnSe had different thicknesses. Their second light guide layers 15 had different thicknesses. However, in each sample, the thickness of the first light guide layer 13 was the same as the thickness of the second light guide layer 15. The light absorption coefficients of these semiconductor laser device samples were measured. The results are indicated by the small triangles and the phantom line in FIG. 3. As can be seen from FIG. 3, the semiconductor laser devices of Example 6 had much smaller light absorption coefficients than the semiconductor laser devices obtained in Comparative Example 3 and were superior in ability to confine light by the light guide layers.

While the preferred embodiments of an optical device according to the present invention have been described, it is to be understood that the invention is not limited thereto. In the illustrated examples, semiconductor laser devices are taken as examples of the optical device. The optical device can take a light waveguide structure. Furthermore, the semiconductor laser devices may take the form of the index guide type, as well as the gain guide type.

Figure 4:
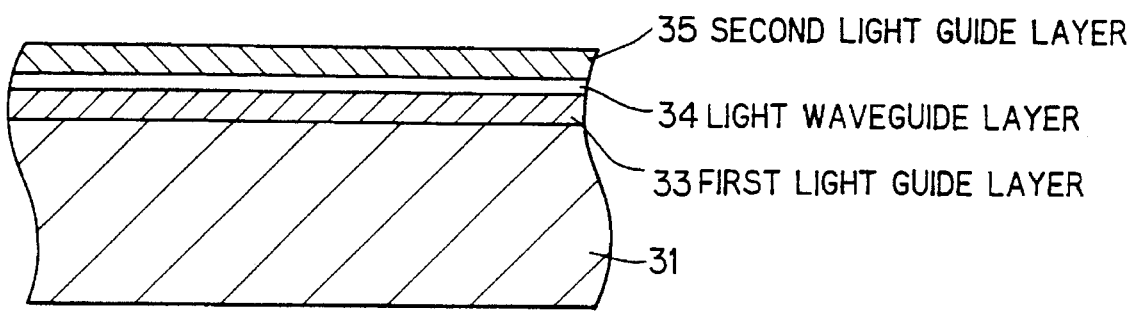
FIG. 4 is a schematic fragmentary cross section of an optical device having a light waveguide structure according to the invention.

The light waveguide structure is partially and schematically shown in FIG. 4. This light waveguide structure can be similar to the structure described in Example 1, for example. In particular, the light waveguide structure comprises a compound semiconductor substrate 31 made from GaAs on which a first light guide layer 33, a light waveguide layer 34, and a second light guide layer 35 are formed. These layers are made from II–VI compound semiconductors. The first light guide layer 33 differs in composition from the second light guide layer 35. For example, the index of refraction of the first light guide layer 33 is set larger than that of the second light guide layer 35. This can effectively suppress exudation of light from the first light guide layer 33 into the compound semiconductor substrate 31. The first light guide layer 33 can be made from ZnSe, and the second light guide layer 35 can be made from ZnSSe. The light waveguide layer 34 can be made from ZnCdSe, for example.

The first and second light guide layers described in Examples 2–6 can be applied to the light waveguide structure. In these cases, it is not necessary to dope the light guide layers with a dopant.

In the illustrated examples, a compound semiconductor substrate made from n-GaAs is used. Instead, a compound semiconductor substrate made from p-GaAs may be employed. In this case, doping of the n-type dopant and doping of the n-type dopant into each layer may be interchanged. Furthermore, instead of using a compound semiconductor substrate made from GaAs, a compound semiconductor substrate made from InP may be used.

The active layer 14 can be made from ZnSe or ZnSSe, as well as from ZnCdSe. Where the active layer 14 is made from ZnSe or ZnSSe, an optical device can be fabricated, using light guide layers having a composition different from the composition of the active layer. Another example of the composition of the light guide layers is $Zn_xMg_{1-x}S_ySe_{1-y}$. In this case, the composition of the light guide layer is so adjusted that the light guide layers have an energy gap which is smaller than the energy gap of the cladding layer and larger than the energy gap of the active layer.

The composition of the first light guide layer is made different from the composition of the second light guide layer. Preferably, the index of refraction of the first light guide layer is made larger than the index of refraction of the second light guide layer. Alternatively, the thickness of the first light guide layer is made different from the thickness of the second light guide layer, and the first light guide layer is preferably made thicker than the second light guide layer. In a further example, the first light guide layer is made different from the second light guide layer in thickness and composition. In this case, the first light guide layer is preferably made thicker than the second light guide layer, and the index of refraction of the first light guide layer is made larger than the index of refraction of the second light guide layer.

In addition, at least one of the first and second light guide layers can take the so-called graded structure. That is, the optical device takes the form of a GRIN-SCH structure. In this case, those portions of the light guide layers which are adjacent to the cladding layer are made from ZnSSe. Those portions of the light guide layers which are adjacent to the active layer or the light waveguide layer are made from ZnSe. The proportion of S is increased from the light guide layers made from ZnSe toward the light guide layers made from ZnSSe, by adopting this GRIN-SCH structure and so the rate of change of the value of the light confinement factor Γ is reduced.

In an optical device according to the present invention, the first light guide layer 13 is made different from the second light guide layer 15 in composition or thickness. Therefore, light can be effectively confined to the light guide layers. Also, increase of the threshold electrical current density and decrease of the differential coefficient can be prevented. That is, the ability to confine light can be improved while maintaining the electrical characteristics of the optical device.

Furthermore, the light absorption loss decreases and so the threshold current density can be lowered. This permits semi-conductor laser oscillation at higher temperatures. Where an index-guided semiconductor laser device is fabricated, the degree to which light is confined is varied by adjusting the thickness or composition of the light guide layers. As a result, the equivalent index of refraction of the stripe portions can be varied, and a step-index profile can be easily accomplished. Additionally, a higher degree of freedom is given in designing the optical device.

What is claimed is:

1. An optical device comprising:

a substrate made from a compound semiconductor;

a first light guide layer formed on said substrate and made from a II–VI compound semiconductor;

an active layer or a light waveguide layer formed on said first light guide layer and made from a II–VI compound semiconductor; and a second light guide layer formed on said active layer or light waveguide layer and made from a II–VI compound semiconductor, said second light guide layer differing from said first light guide layer in composition.

2. The optical device of claim 1, wherein said first light guide layer has an index of refraction larger than an index of refraction of said second light guide layer.

3. An optical device comprising:

a substrate made from a compound semiconductor;

a first light guide layer formed on said substrate and made from a II–VI compound semiconductor;

an active layer or a light waveguide layer formed on said first light guide layer and made from a II–VI compound semiconductor; and a second light guide layer formed on said active layer or light waveguide layer and made from a II–VI compound semiconductor, said second light guide layer differing from said first light guide layer in thickness and composition.

4. The optical device of claim 3, wherein said first light guide layer is thicker than said second light guide layer and has an index of refraction larger than an index of refraction of said second light guide layer.

5. The optical device of claim 1, wherein said first light guide layer is made from ZnSe, and wherein said second light guide layer is made from ZnSSe.

6. The optical device of claim 1, wherein said optical device is a semiconductor laser device.

7. The optical device of claim 1, wherein said optical device has a light waveguide structure.

* * * * *